US007161347B1

(12) United States Patent
Miller et al.

(10) Patent No.: US 7,161,347 B1
(45) Date of Patent: Jan. 9, 2007

(54) TEST HEAD FOR SEMICONDUCTOR INTEGRATED CIRCUIT TESTER

(75) Inventors: Will A. Miller, Camas, WA (US); Wesley G. Stanley, Milwaukie, OR (US); David R. Trine, Portland, OR (US)

(73) Assignee: Credence Systems Corporation, Milpitas, CA (US)

( * ) Notice: Subject to any disclaimer, the term of this patent is extended or adjusted under 35 U.S.C. 154(b) by 0 days.

(21) Appl. No.: 11/178,092

(22) Filed: Jul. 8, 2005

(51) Int. Cl.
*G01R 31/28* (2006.01)
(52) U.S. Cl. .................................................. 324/158.1
(58) Field of Classification Search .................... None
See application file for complete search history.

(56) References Cited

U.S. PATENT DOCUMENTS

| | | | | |
|---|---|---|---|---|
| 4,377,318 | A * | 3/1983 | Long ............................. | 439/51 |
| 4,987,365 | A * | 1/1991 | Shreeve et al. ............... | 324/758 |
| 4,992,631 | A * | 2/1991 | Gee ............................. | 200/5 A |
| 5,559,446 | A * | 9/1996 | Sano ............................ | 324/760 |
| 5,565,787 | A * | 10/1996 | Perego ......................... | 324/755 |
| 5,955,876 | A * | 9/1999 | Yamauchi et al. ............ | 324/158.1 |
| 6,118,292 | A * | 9/2000 | Antonello et al. ............. | 324/758 |
| 6,130,547 | A * | 10/2000 | Kato ............................. | 324/761 |
| 6,292,003 | B1 * | 9/2001 | Fredrickson et al. .......... | 324/754 |
| 6,307,386 | B1 * | 10/2001 | Fowler et al. ................. | 324/754 |
| 6,420,888 | B1 * | 7/2002 | Griffin et al. .................. | 324/754 |
| 6,951,482 | B1 * | 10/2005 | Miller et al. ................... | 439/581 |
| 2002/0190739 | A1 * | 12/2002 | Farnworth et al. ............. | 324/755 |
| 2005/0264311 | A1 * | 12/2005 | Sinsheimer et al. ............ | 324/758 |

* cited by examiner

*Primary Examiner*—Vinh Nguyen
*Assistant Examiner*—Richard Isla-Rodas
(74) *Attorney, Agent, or Firm*—John Smith-Hill; Smith-Hill and Bedell

(57) ABSTRACT

A test head for a semiconductor integrated circuit tester includes a main support structure defining a device interface board location, and a contact support frame that is displaceable relative to the main support structure for engaging a device interface board at the device interface board location. The contact support frame is composed of a first frame member having a first surface region that is directed towards the device interface board location and also having an opposite second surface region, a second frame member having a first surface region in spaced confronting relationship with the second surface region of the first frame member and also having an opposite second surface region, and a resilient mechanism effective between the first and second frame members for permitting the first frame member to move relative to the second frame member when force is applied to the second frame member at the second surface region thereof for displacing the contact support frame towards the device interface board location.

11 Claims, 3 Drawing Sheets

TEST HEAD FOR SEMICONDUCTOR INTEGRATED CIRCUIT TESTER

CROSS-REFERENCE TO RELATED APPLICATIONS

Subject matter disclosed in this application may be considered to be related to matter disclosed in U.S. patent application Ser. No. 10/802,993 filed Mar. 16, 2004, now U.S. Pat. No. 6,951,482; U.S. patent application Ser. No. 10/458,342 filed Jun. 9, 2003; U.S. patent application Ser. No. 11/024,528 filed Dec. 28, 2005; U.S. patent application Ser. No. 11/024,536 filed Dec. 28, 2004; U.S. patent application Ser. No. 11/096,337 filed Mar. 31, 2005, the entire disclosure of each of which is hereby incorporated by reference herein for all purposes.

BACKGROUND OF THE INVENTION

This invention relates to a test head for a semicondcuctor integrated circuit (IC) tester.

U.S. patent application Ser. No. 11/024,536 filed Dec. 28, 2004 describes a semiconductor integrated circuit tester comprising a test head that includes a circular device interface board (DIB) having an annular array of contact elements exposed at the underside of the DIB, and an annular support frame that is located below the DIB and is moveable vertically relative to the DIB. The support frame defines multiple radial slots that accommodate respective electrical connectors, which may be as described in co-pending patent application Ser. No. 10/802,993 filed Mar. 16, 2004. Each connector includes a cable positioning block in which the ends of multiple coaxial cables are held, with the conductive cores of the coaxial cables constituting contact elements that are exposed at the upper surface of the positioning block and vertically aligned with respective contact elements of the DIB. Ideally, the upper surfaces of the contact elements of the connector would all lie in a common horizontal plane and the lower surfaces of the contact elements of the DIB would all lie in a common horizontal plane so that vertical movement of the support frame would result in the contact elements of the connector simultaneously contacting the corresponding contact elements of the DIB. However, in practice the upper surfaces of the contact elements of the connector do not lie in a common horizontal plane and the lower surfaces of the contact elements of the DIB do not lie in a common horizontal plane.

We can define the contact plane of a connector as the plane for which the sum of the squares of the distances of the upper surfaces of the contact elements of the connector from that plane is a minimum and similarly we can define the contact plane of the corresponding group of contact elements of the DIB as the plane for which the sum of the squares of the distances of the lower surfaces of the contact elements from that plane is a minimum. It is possible to manufacture the connector so that the variance in distance of the upper surfaces of the contact elements from the contact plane of the connector lies within a narrow range. Similarly, it is possible to manufacture the DIB so that the variance in distance of the lower surfaces of the contact elements in a given group from the contact plane lies within a narrow range.

U.S. patent application Ser. No. 10/802,993 filed Mar. 16, 2004 discloses an interconnect system that is able to accommodate the variations in distance between the confronting contact elements due to manufacturing tolerances when the contact plane of the connector is parallel to the contact plane of the corresponding group of contact elements of the DIB, but the interconnect system may not be able to accommodate the variations in distance between the contact elements of the connector and contact elements of the DIB in the event that the contact planes are significantly out of parallel.

One source of departures from parallelism of the contact plane of the connector and the contact plane of the corresponding contact elements of the DIB is nonuniformity in thickness of the DIB. Using conventional techniques it is possible to manufacture the DIB so that the upper and lower surfaces of the DIB are essentially planar, but it is more difficult to ensure that the upper and lower surfaces are parallel. For example, the DIB might vary in thickness by up to 2.5 mm along a diameter of the DIB. If the DIB is mounted so that its upper surface is horizontal, but the upper and lower surfaces of the DIB are not parallel, the lower surface of the DIB will not be horizontal.

When the lower surface of the DIB is generally horizontal, the contact plane of a connector might nevertheless not be parallel to the contact plane of the corresponding group of contact elements of the DIB because of local departures from horizontal of the lower surface of the DIB or because the connector is mounted in the support frame in a manner such that its contact plane is not horizontal.

SUMMARY OF THE INVENTION

In accordance with a first aspect of the present invention there is provided a test head for a semiconductor integrated circuit tester, the test head comprising a main support structure defining a device interface board location, and a contact support frame that is displaceable relative to the main support structure for engaging a device interface board at the device interface board location, the contact support frame comprising a first frame member having a first surface region that is directed towards the device interface board location and also having an opposite second surface region, a second frame member having a first surface region in spaced confronting relationship with the second surface region of the first frame member and also having an opposite second surface region, and a resilient mechanism effective between the first and second frame members for permitting the first frame member to move relative to the second frame member when force is applied to the second frame member at the second surface region thereof for displacing the contact support frame towards the device interface board location.

In accordance with a second aspect of the present invention there is provided a test head for a semiconductor integrated circuit tester, the test head comprising a main support structure defining a device interface board location, a connector support frame that is displaceable relative to the main support structure for engaging a device interface board at the device interface board location, the connector support frame having a first surface region that is directed towards the device interface board location and a second surface region opposite the first surface region, and a connector member attached to the connector support frame in a manner permitting movement of the connector member relative to the connector support frame.

BRIEF DESCRIPTION OF THE DRAWINGS

For a better understanding of the invention, and to show how the same may be carried into effect, reference will now be made, by way of example, to the accompanying drawings, in which.

For brevity, the following detailed description describes a test head embodying the invention when the test head is oriented in the so-called DUT up position. However, this is not intended to imply that the test head may not be used in other orientations, including the DUT down orientation, or that the claims should be limited to a particular orientation.

DETAILED DESCRIPTION

Figure 1:
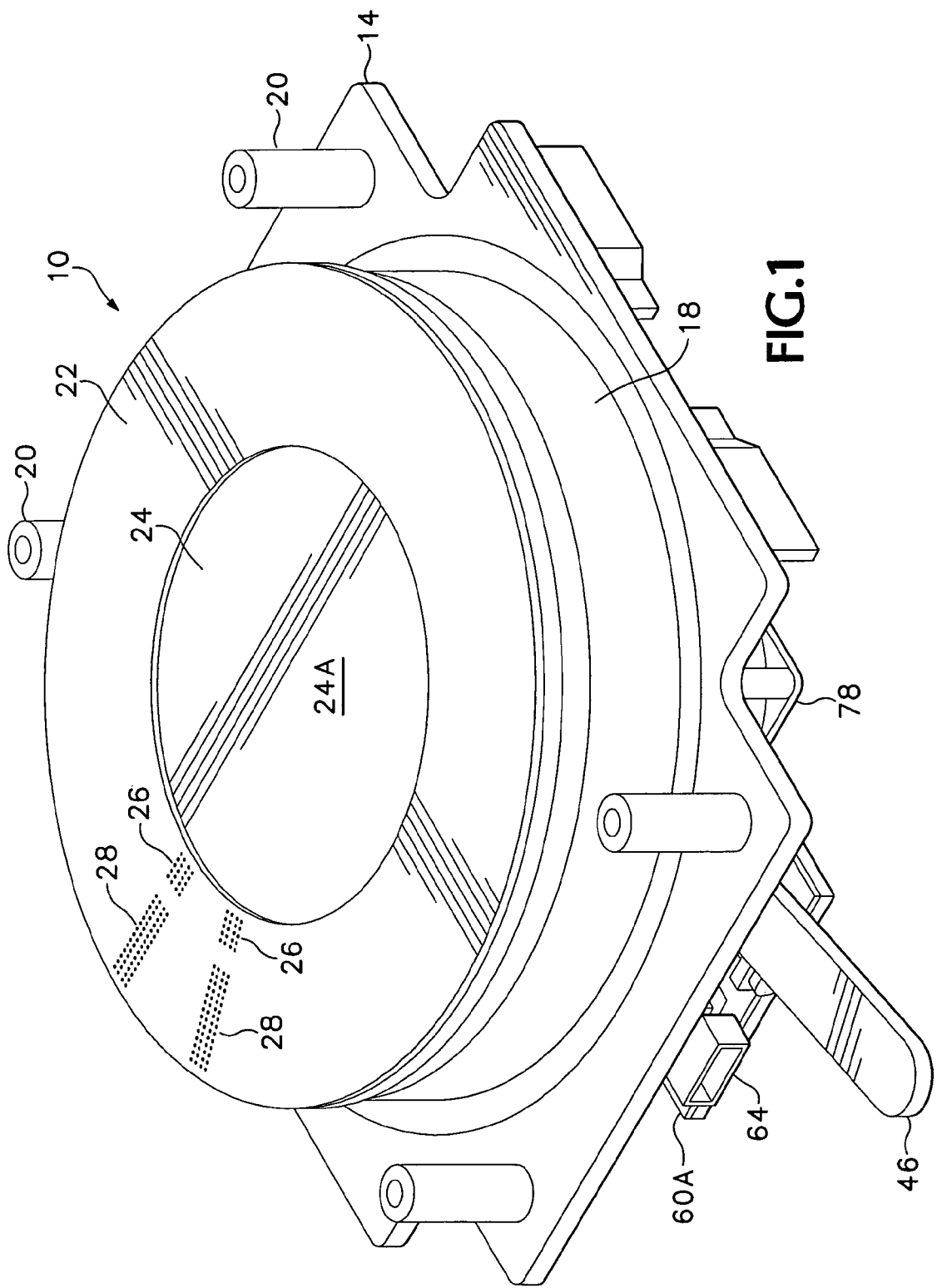
FIG. 1 is a perspective view of a test head embodying the present invention.

FIG. 1 illustrates a test head 10 comprising a main support plate 14 to which a cylindrical outer housing 18 is attached. Alignment pins 20 are secured to the main support plate 14 and are used for docking the test head to failure analysis equipment such as an electron beam probe.

Figure 2:
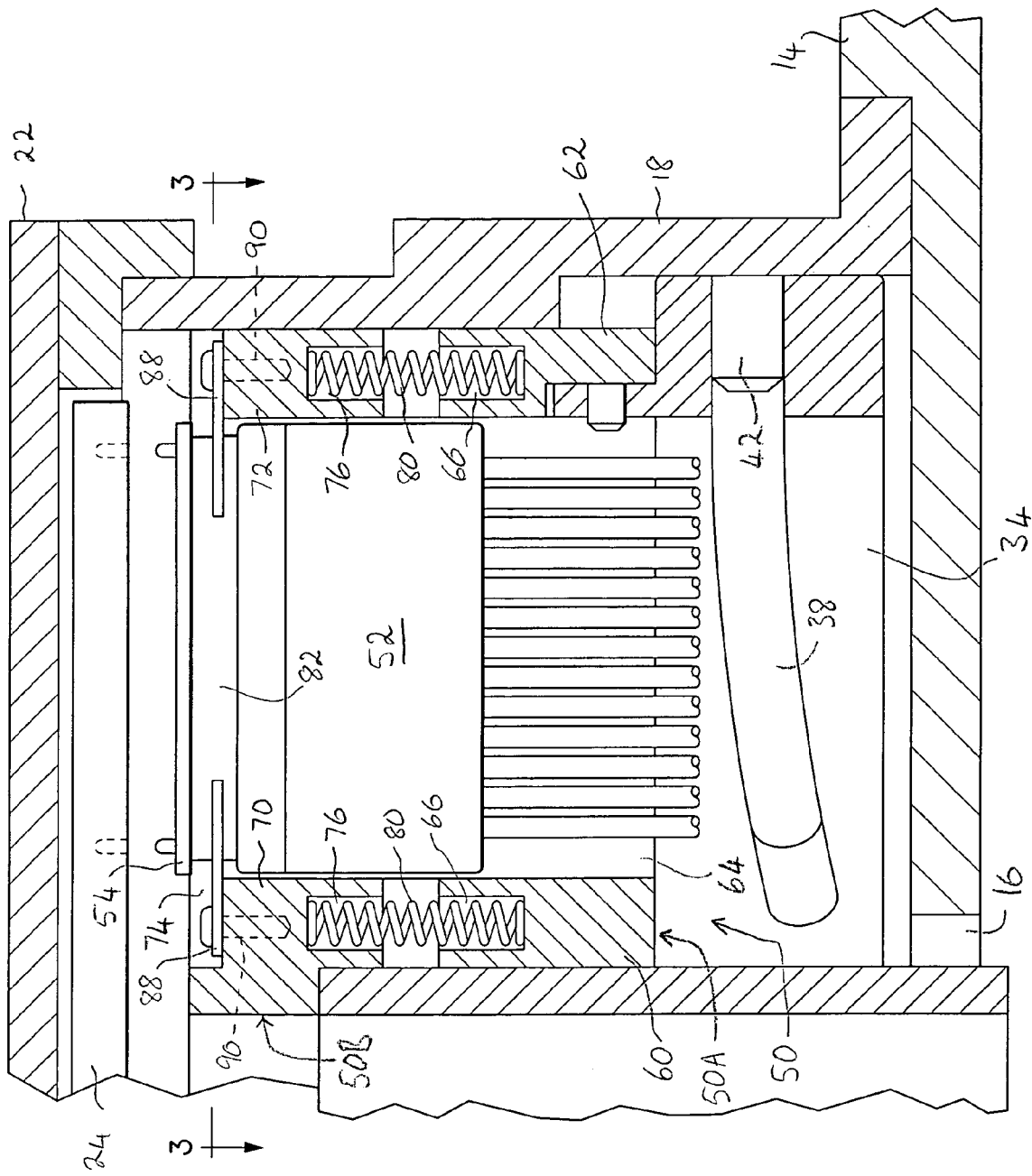
FIG. 2 is an enlarged partial sectional view of the test head.

The main support plate 14 defines a circular opening 16 (FIG. 2). An annular cover plate 22 is attached to the outer housing 18. A circular device interface board (DIB) 24 is accommodated within the cylindrical outer housing 18 and has a central region 24A that is exposed through the central opening in the annular cover plate 22. Several DUT sockets (not shown) are attached to the DIB in the central region 24A for receiving respective semiconductor integrated circuit devices under test. Each DUT socket includes power supply pins for supplying operating power to the DUT and signal pins for supplying test signals to, and receiving test signals from, the DUT.

The DIB 24 is formed with two concentric annular arrays of contact elements each comprising a via, the lower end of which is exposed at the underside of the DIB, and an annular contact pad surrounding the lower end of the via. The locations of the contact elements are illustrated schematically in FIG. 1 by the dots on the cover plate 22. The inner annular array of contact elements is composed of sixteen discrete groups 26 of contact elements (the locations of only two groups are shown) in respective sector-shaped regions of the inner array. The contact elements of the inner array include power supply contact elements that are connected through conductive traces of the DIB to the power supply pins of the DUT sockets. The contact elements of the inner array also include control signal contact elements. The outer annular array of contact elements is composed of sixty eight discrete groups 28 of contact elements (the locations of only two groups are shown) in respective sector-shaped regions of the outer array. The contact elements of the outer array are test signal contact elements and are connected through conductive traces of the DIB to the signal pins of the DUT sockets.

Referring to FIG. 2, a cam ring 34 is located above the support plate 14 and within the outer housing 18. The cam ring is coaxial with the outer housing and is formed with multiple helical cam slots 38, only one of which is shown in the drawings. Cam followers 42 attached to the outer housing 18 project radially into the cam slots 38 respectively. The cam ring 84 is located in a manner that allows the cam ring to move vertically relative to the outer housing 18 and to rotate relative to the outer housing. The cam ring 34 is attached to a cam operating lever 46 (FIG. 1) that can be actuated to rotate the cam ring relative to the outer housing and thereby raise or lower the cam ring relative to the main support plate 14.

Referring again to FIG. 2, an annular connector support frame 50 is located inside the outer housing 18 and is restrained against rotation within the outer housing 18. The support frame 50 is located in a manner that allows it to move vertically relative to the main support plate 14 and is coupled to the cam ring 34 in a manner that permits rotational movement of the cam ring relative to the support frame but prevents vertical movement of the cam ring relative to the support frame. The support frame 50 defines multiple radial slots that accommodate respective electrical connectors 52, which may be as described in copending patent application Ser. No. 10/802,993 filed Mar. 16, 2004.

Each connector 52 includes a cable positioning block in which the ends of multiple coaxial cables 53 are held, with the conductive cores of the coaxial cables exposed at the upper surface of the positioning block. Above the cable positioning block is a contact device 54 comprising an insulating member having multiple C-shaped conductive elements accommodated therein.

The DIB 24 is positioned over the support frame 50 and is captive beneath the cover plate 22. Alignment elements (not shown) projecting from the outer housing 18 engage the DIB and thereby position the DIB relative to the outer housing. Alignment pins project upwards from the connectors 52 and are received in alignment bores of the DIB 24, thereby positioning the connectors relative to the DIB, when the support frame is forced upward by actuation of the cam operating lever 46.

Each of the sixty eight groups 28 of contact elements on the lower surface of the DIB 24 corresponds to one of the connectors 52, and the pattern of contact elements in each group 28 matches the pattern of the conductive cores of the coaxial cables 53 held by the corresponding connector.

Still referring to FIG. 2, the support frame 50 comprises a lower frame 50A and an upper frame 50B. The lower frame 50A is composed of inner and outer rings 60, 62 connected by radial webs 64. The inner and outer rings of the lower frame each have multiple spring retaining bores 66 entering the ring at its upper axial end and extending parallel to the axis of the lower frame. The upper frame is similarly composed of inner and outer rings 70, 72 connected by radial webs 74 and the inner and outer rings 70, 72 each have multiple spring retaining bores 76 entering the ring at the lower axial end and extending parallel to the central axis of the upper frame. The spring retaining bores 66 of the lower frame are axially aligned with corresponding bores 76 of the upper frame and helical compression springs 80 are installed in the spring retaining bores so that one end of each spring 80 is received in a bore 66 of the lower frame and the opposite end of the spring is received in the corresponding bore 76 of the upper frame. In this way the springs 80 support the upper frame 50B relative to the lower frame 50A.

Figure 3:
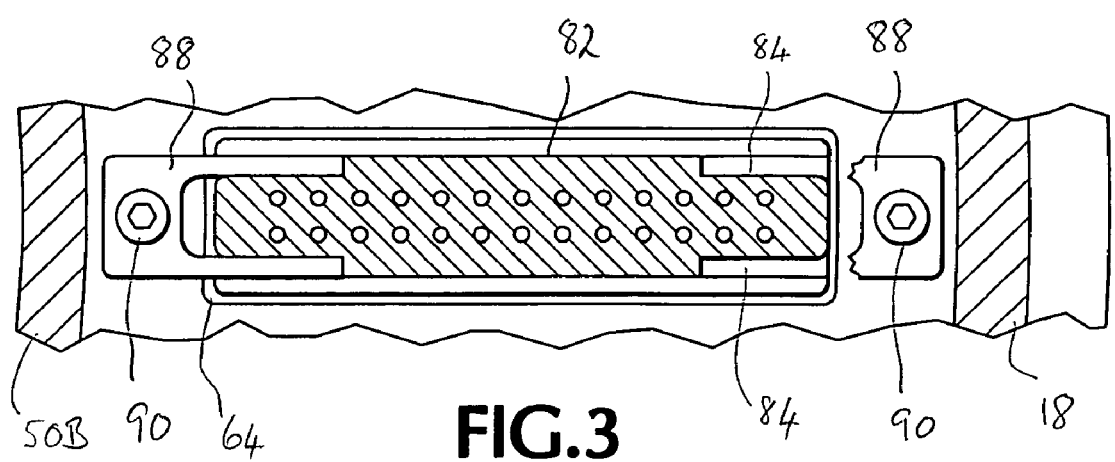
FIG. 3 is a view taken on the line 3—3 in FIG. 2.

Referring also to FIG. 3, the positioning block has an upper part 82 that is generally rectangular in external configuration, having two parallel longer faces that extend substantially radially of the annular frame and two parallel shorter faces perpendicular to the longer faces. Each of the two longer faces is formed with two grooves or channels 84 at opposite respective ends of the face. Thus, at each end of the upper part of the positioning block there is a pair of grooves 84, the two grooves of a pair being at opposite respective sides of the positioning block.

The positioning block is supported in its slot 64 in the support frame by two resilient retaining clips 88 made of spring steel or other material having similar mechanical properties. Each clip is substantially U-shaped when viewed in plan, having a base and two parallel limbs. The clips are applied to the positioning block by fitting the two limbs of each clip in one pair of grooves 84. Referring to FIG. 2, the clips are attached to the upper frame 50B by screws 90 that pass through the base of the U and are received in the inner and outer rings 70 and 72 respectively. The resilient nature of the clips allows limited movement of the positioning block relative to the support frame.

When the cam operating lever 46 is actuated to raise the cam ring from its lower position to its upper position, the lower frame 50A is correspondingly forced upward. As the lower frame rises, initially the upper frame 50B moves with the lower frame. If the underside of the DIB is planar but is not perpendicular to the axis of movement of the lower frame 50A, the connector 52 at one peripheral region of the support frame 50 will encounter resistance before the connectors 52 at other peripheral regions of the support frame, and the support frame is able to accommodate this departure from ideal conditions by permitting tilting of the upper frame relative to the lower frame as the lower frame continues to rise until the cam ring reaches its upper position. Accordingly, if the contact planes of the connectors are coplanar and the contact planes of the groups of contact elements of the DIB are parallel to the lower surface of the DIB and are coplanar, the tilting of the upper frame allows the contact planes of the connectors to be brought into substantially parallel relationship with the contact planes of the corresponding groups of contact elements of the DIB and allows sufficient force to be applied to all the connectors to establish electrically conductive pressure contact between the cores of the coaxial cables held by the connectors 52 and the corresponding contact elements on the lower surface of the DIB.

In an embodiment of the invention, the structure of the support frame 50 is able to accommodate a variation in thickness of the DIB from about 3.75 mm to about 6.25 mm along a diameter of the DIB.

In the event that the lower surface of the DIB is not planar, such that there are minor local variations in height of the underside of the DIB and the contact planes of the DIB are not coplanar, or the contact planes of the connectors are not coplanar, the spring clips 88 securing each positioning block to the upper frame 50B allow tilting movement of the positioning block relative to the upper frame 50B and allow a small amount of vertical movement of the positioning block relative to the upper frame 50B, thereby accommodating these minor departures from parallelism and coplanarity.

Provided that the contact plane of a connector is substantially parallel to the contact plane of the corresponding group of contact elements of the DIB, the C-shaped conductive elements of the contact device 54 provide electrical connections between the contact elements of the connector and respective contact elements of the DIB 24.

It will be appreciated that the invention is not restricted to the particular embodiment that has been described, and that variations may be made therein without departing from the scope of the invention as defined in the appended claims and equivalents thereof. Unless the context indicates otherwise, a reference in a claim to the number of instances of an element, be it a reference to one instance or more than one instance, requires at least the stated number of instances of the element but is not intended to exclude from the scope of the claim a structure or method having more instances of that element than stated. Further, a reference in the foregoing description to an element, be it a reference to one instance of that element or more than one instance, is not intended to imply that any claim should be interpreted as if it required that element or that embodiments of the invention could not be implemented without that element.

The invention claimed is:

1. A test head for a semiconductor integrated circuit tester, the test head comprising:
   a main support structure defining a device interface board location, and
   a contact support frame that is displaceable relative to the main support structure for engaging a device interface board at the device interface board location, the contact support frame comprising a first frame member having a first surface region that is directed towards the device interface board location and also having an opposite second surface region, a second frame member having a first surface region in spaced confronting relationship with the second surface region of the first frame member and also having an opposite second surface region, and a resilient mechanism effective between the first and second frame members for permitting the first frame member to move relative to the second frame member when force is applied to the second frame member at the second surface region thereof for displacing the contact support frame towards the device interface board location,
   and wherein the main support structure comprises a main support plate and a generally cylindrical outer frame attached to the main support plate, and the contact support frame is generally annular and is located within the outer frame and is coaxial therewith.

2. A test head according to claim 1, wherein the outer frame has a first end at which it is attached to the main support plate and an opposite second end at which it defines the device interface board location, and the test head further comprises a displacement mechanism located between the main support plate and the contact support frame for urging the second frame member axially towards the first end of the outer frame.

3. A test head according to claim 2, wherein the displacement mechanism comprises a cam ring that is located within the outer frame and is formed with helical cam slots and has a thrust surface for engaging the second frame member, and cam followers attached to the outer frame and projecting into the cam slots respectively.

4. A test head according to claim 3, wherein the cam ring is formed with an arcuate slot and the second frame member includes a restraining member that projects into the arcuate slot, whereby axial relative movement of the second frame member and the cam ring is limited.

5. A test head for a semiconductor integrated circuit tester, the test head comprising:
   a main support structure defining a device interface board location, and
   a contact support frame that is displaceable relative to the main support structure for engaging a device interface board at the device interface board location, the contact support frame comprising a first frame member having a first surface region that is directed towards the device interface board location and also having an opposite second surface region, a second frame member having a first surface region in spaced confronting relationship with the second surface region of the first frame member and also having an opposite second surface region, and a resilient mechanism effective between the first and second frame members for permitting the first frame member to move relative to the second frame member when force is applied to the second frame member at the second surface region thereof for displacing the contact support frame towards the device interface board location, and wherein the first frame member and the second frame member are generally annular and each comprises an inner ring, an outer ring and radial connecting webs.

6. A test head according to claim 5, wherein the first frame member and the second frame member are each formed with a set of spring retaining bores, each spring retaining bore of the first frame member being aligned with a corresponding spring retaining bore of the second frame member, and the resilient mechanism comprises a set of compression springs each having a first end received in a spring retaining bore of the first frame member and a second end received in the corresponding spring retaining bore of the second frame member.

7. A test head according to claim 6, wherein the sets of spring retaining bores are each composed of a first subset of bores formed in the inner ring and a second subset of bores formed in the outer ring.

8. A test head for a semiconductor integrated circuit tester, the test head comprising:

a main support structure defining a device interface board location, and a contact support frame that is displaceable relative to the main support structure for engaging a device interface board at the device interface board location, the contact support frame comprising a first frame member having a first surface region that is directed towards the device interface board location and also having an opposite second surface region, a second frame member having a first surface region in spaced confronting relationship with the second surface region of the first frame member and also having an opposite second surface region, and a resilient mechanism effective between the first and second frame members for permitting the first frame member to move relative to the second frame member when force is applied to the second frame member at the second surface region thereof for displacing the contact support frame towards the device interface board location, and wherein the first frame member and the second frame member are each formed with a set of spring retaining bores, each spring retaining bore of the first frame member being aligned with a corresponding spring retaining bore of the second frame member, and the resilient mechanism comprises a set of compression springs each having a first end received in a spring retaining bore of the first frame member and a second end received in the corresponding spring retaining bore of the second frame member.

9. A test head for a semiconductor integrated circuit tester, the test head comprising:

a main support structure defining a device interface board location, a connector support frame that is displaceable relative to the main support structure for engaging a device interface board at the device interface board location, the connector support frame having a first surface region that is directed towards the device interface board location and a second surface region opposite the first surface region, and a connector member attached to the connector support frame in a manner permitting movement of the connector member relative to the connector support frame, the connector member including a plurality of electrically conductive contact elements for making electrically conductive contact with contact pads on a device interface board at the device interface board location.

10. A test head according to claim 9, wherein the connector member is attached to the connector support frame by at least one resilient member that permits movement of the connector member relative to the connector support frame.

11. A test head according to claim 9, wherein the connector member is substantially rectangular in section, having two opposite longer faces and two opposite shorter faces, each of the two longer faces is formed with two grooves at opposite respective ends of the longer face, the test head comprises two U-shaped spring members each having a base and two parallel limbs, each spring member is secured at its base to the connector support frame, and the two limbs of each spring member are received in respective grooves at opposite respective sides of the connector member.

* * * * *